United States Patent
Bienstman et al.

(10) Patent No.: US 6,603,605 B1
(45) Date of Patent: Aug. 5, 2003

(54) SYSTEM FOR GUIDING A BEAM OF ELECTROMAGNETIC RADIATION

(75) Inventors: Peter Bienstman, Melle (BE); Roel Baets, Deinze (BE)

(73) Assignees: Interuniversitair Microelektronica Centrum (IMEC, VZW), Leuven (BE); Universiteit Gent, Ghent (BE)

(*) Notice: Subject to any disclaimer, the term of this patent is extended or adjusted under 35 U.S.C. 154(b) by 0 days.

(21) Appl. No.: 09/707,346

(22) Filed: Nov. 6, 2000

Related U.S. Application Data

(60) Provisional application No. 60/170,097, filed on Dec. 10, 1999.

(30) Foreign Application Priority Data

Nov. 5, 1999 (EP) .............................. 99870231

(51) Int. Cl.$^7$ ................................. G02B 1/10
(52) U.S. Cl. ...................... 359/588; 359/580; 359/582; 359/260
(58) Field of Search ................. 359/587, 584, 359/580, 260, 261, 588, 589, 590; 372/7

(56) References Cited

U.S. PATENT DOCUMENTS 5,315,128 A * 5/1994 Hunt et al. .................. 257/16
5,369,657 A * 11/1994 Cho et al. .................... 372/39

OTHER PUBLICATIONS

P. Bienstman, R. Baets, "The RC2LED: A novel resonant-cavity LED design using a symmetric resonant cavity in the outcoupling reflector", IEEE J. Quantum Electr., vol. 36, 2000, pp. 669–673.*

H. Benisty, H. De Neve, C. Weisbuch, "Impact of planar microcavity effects on light extraction– PartI: Basic concepts and analytical trends", IEEE J. Quantum Electr., col. 34, 1998, pp. 1612–1631.*

R. Bockstaele et al, "Resonant Cavity LED's Optimized for Coupling to Polymer Optical Fibers", IEEE Phot. Techn. Lett., vol. 11, pp. 158–160, 1999.

H. De Neve et al., "Recycling of Guided Mode Light Emission in Planar Microcavity Light Emitting Diodes", Appl. Phys. Lett., vol. 70, No. 7, pp. 799–801, 1997.

* cited by examiner

Primary Examiner—Thong Nguyen
Assistant Examiner—Arnel C. Lavarias
(74) Attorney, Agent, or Firm—McDonnell Boehnen Hulbert & Berghoff

(57) ABSTRACT

A system and method for guiding a beam of electromagnetic radiation is disclosed. The system includes at least a first stack of dielectric layers, the first stack comprising at least a first substack, a second substack and a third substack, the third substack separating said first and second substack, the first substack comprising at least one dielectric layer, the second substack comprises at least one dielectric layer, the third substack comprises at least one dielectric layer. The dielectric layers of the first substack and the second substack equidistant from the third substack have the same refractive index. The sum of the thickness of dielectric layers of the first substack and the second substack equidistant from said third substack is a multiple of half of the vacuum wavelength of the beam divided by the refractive index of the dielectric layers of the first substack and the second substack having a same distance from the third substack, the third substack thickness being substantially different from a quarter of the vacuum wavelength of the beam divided by the refractive index of the one dielectric layer of the third substack.

7 Claims, 3 Drawing Sheets

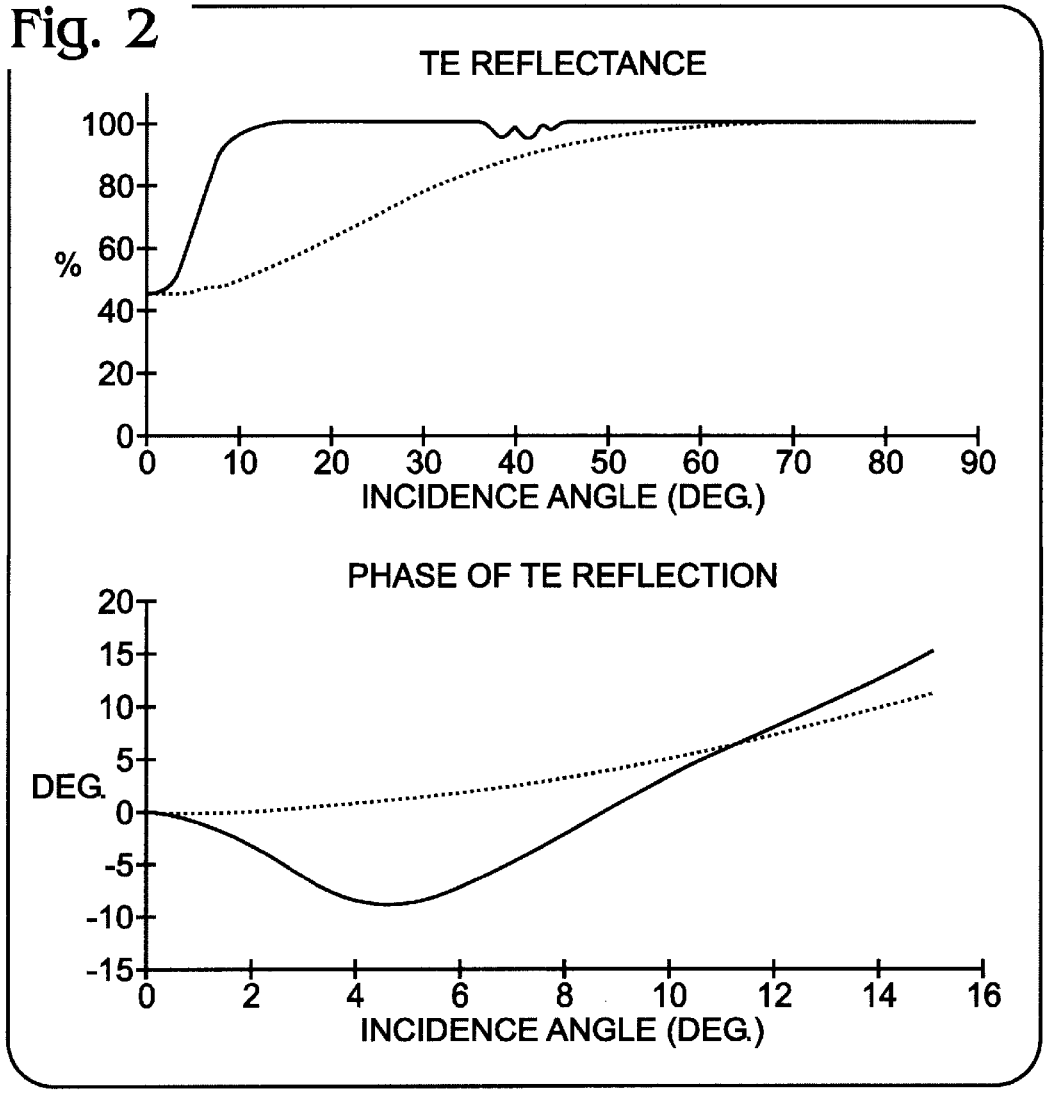

SYSTEM FOR GUIDING A BEAM OF ELECTROMAGNETIC RADIATION

REFERENCE TO RELATED APPLICATIONS

This application claims priority benefits to European Patent Application No. EP 99870231.0 filed on Nov. 5, 1999. This application also claims priority benefits to U.S. provisional application Serial No. 60/170,097 filed on Dec. 10, 1999. This application incorporates by reference in its entirety U.S. provisional application Serial No. 60/170,097 filed on Dec. 10, 1999.

FIELD OF THE INVENTION

The present invention relates to a system for guiding or transferring a beam of electromagnetic radiation, the system comprising planar media, and in particular a stack of dielectric media with a plurality of refractive indices and thicknesses. The electromagnetic radiation can be light, in which case the system is denoted an optical system.

BACKGROUND OF THE INVENTION

Recently, resonant cavity light emitting diodes have attracted considerable interest, mainly because of the possibility of increased extraction efficiency as compared to standard LEDs. Record efficiencies as high as 20% have been reported in, for example, H. De Neve et al., "Recycling of Guided Mode Light Emission in Planar Microcavity Light Emitting Diodes", Appl. Phys. Lett., vol. 70, no. 7, pp. 799–801, 1997. However, these devices exhibit a wide radiation pattern, making them less suited to fiber applications.

In the past, efforts have been undertaken to design resonant cavity light emitting diodes with a narrower radiation pattern, as explained for example in R. Bockstaele et al, "Resonant Cavity LED's Optimized for Coupling to Polymer Optical Fibers", IEEE Phot. Techn. Lett., vol. 11, pp. 158–160, 1999. This approach involves growing an undertuned cavity, i.e. a cavity that is too short as compared to the resonance wavelength. This yields narrower radiation patterns, but unfortunately at the expense of lower extraction efficiencies since the microcavity resonance only enhances a limited subset of the spectral and angular spectrum emitted by the active layer.

AIM OF THE INVENTION

It is an aim of the invention to provide a system and method for designing of resonant cavities with narrow radiation patterns.

SUMMARY OF THE INVENTION

The invented system guides a beam of electromagnetic radiation. The system comprises a stack of dielectric layers with a plurality of refractive indices and thicknesses of the layers. In the system, at least a first stack of dielectric layers with the following properties is disclosed. The first stack comprises at least a first substack, a second substack and a third substack, the third substack separating the first and second substack. The first substack comprises at least one dielectric layer, possibly a plurality of dielectric layers, the second substack comprises at least one dielectric layer, possibly a plurality of dielectric layers. Dielectric layers of the first substack and the second substack equidistant from the third substack have the same refractive index. Moreover, the sum of the thickness of dielectric layers of the first substack and the second substack equidistant from the third substack is a multiple of half of the vacuum wavelength of the beam divided by the refractive index of the dielectric layers of the first substack and the second substack having a same distance from the third substack. Further, the third substack thickness is substantially different from a quarter of the vacuum wavelength of the beam divided by the refractive index of the one dielectric layer of the third substack.

In a first aspect of the present invention, the first substack and the second substack each has an odd number of layers.

In a first embodiment of the first aspect of the present invention, the first substack and the second substack comprise dielectric layers with refractive indices $n_1$ and $n_2$.

In a second embodiment of the first aspect of the present invention, the refractive indices are substantially different such that the equivalent penetration depth of the beam is negative. The first substack can comprise a first and second layer with refractive index $n_2$, a third layer with refractive index nl, the first and the third layer being attached to each other, the second and the third layer being attached to each other, and the first and the second layer not being attached to each other. Alternatively, the first substack can be a concatenation of a first layer with refractive index $n_2$, a second layer with refractive index no and a third layer with refractive layer $n_2$. In this case, the third substack can be a dielectric layer with index $n_1$.

In a second aspect of the present invention, the first stack of dielectric layers is substantially transparent for normal incidence radiation and substantially reflective for off-axis incidence radiation.

In a third aspect of the present invention, the third substack comprises a periodic repetition of at least one of the stacks. This periodic repetition can be a periodic repetition of the first and the second stack, the refractive index of the dielectric layers possibly being different for at least two repetitions. This periodic repetition can also be a periodic repetition of the first stack. In this case, the refractive index of the dielectric layers can possibly be different for at least two repetitions.

In a fourth aspect of the present invention, the second stack of dielectric layers consists of a dielectric layer with refractive index n, and the thickness of the dielectric layer is a quarter of the vacuum wavelength of the beam divided by $n_1$.

In a fifth aspect of the present invention, the third substack comprises a second stack of dielectric layers, the second stack of dielectric layers being substantially reflective for normal incidence radiation. The reflectivity of the second stack lies preferably within the range of 40 to 70%, advantageously being approximately 60%.

In another aspect of the present invention, the first stack of dielectric layers has a normal incidence matrix being substantially equal to the unit matrix.

In another aspect of the present invention, the third substack comprises a second stack of dielectric layers and at least one electromagnetic generating layer, the system having a narrow radiation pattern.

In another aspect of the present invention, at least one layer of the first or second stack has a thickness substantially different from a quarter of the vacuum wavelength of the beam divided by the refractive index of the layer of the first or second stack.

In another aspect of the present invention, the third substack consists of a single dielectric layer with a refractive index $n_C$ with a thickness equal to a multiple of half of the vacuum wavelength of the beam divided by $n_C$.

Another aspect of the present invention relates to a method for generating a first beam of electromagnetic radiation with a narrow radiation pattern, comprising the steps:

providing a system according to the invention as described above, generating a second beam of electromagnetic radiation with a wide radiation pattern;

letting the second beam resonate in between a first and a second structure; wherein the first structure being substantially transparent for normal incidence of the second beam on the first structure and substantially reflective for off-axis incidence of the second beam and the second structure being adapted for partly reflecting the second beam in a off-axis direction; and the part of the second beam being transferred through the first structure being the first beam.

Another aspect of the present invention relates to a method for generating a first beam of electromagnetic radiation with a narrow radiation pattern, comprising the steps:

providing a system according to the invention such as described above, generating a second beam of electromagnetic radiation with a wide radiation pattern;

letting the second beam resonate in between a first and a second structure; wherein the first structure being substantially transparent for normal incidence of the second beam on the first structure and the first structure being adapted for having a negative equivalent penetration depth; and the part of the second beam being transferred through the first structure being the first beam.

Another aspect of the present invention relates to a method for generating a first beam of electromagnetic radiation with a narrow radiation pattern, comprising the steps:

generating a second beam of electromagnetic radiation with a wide radiation pattern;

letting the second beam resonate in between a first and a second structure; wherein the first structure comprising a first substructure and a second substructure, the first substructure being substantially reflective for normal incidence for normal incidence of the second beam, the second substructure being substantially reflective for off-axis incidence of the second beam and substantially transparent for normal incidence of the second beam; and the part of the second beam being transferred through the first structure being the first beam.

BRIEF DESCRIPTION OF THE DRAWINGS

FIG. 2 shows the TE reflectance, both amplitude (%) and phase (deg), of the system comprising the first stack and the second stack for normal incidence of the beam from the direction of the second stack.

DETAILED DESCRIPTION OF EXEMPLARY EMBODIMENTS

The invented system guides a beam of electromagnetic radiation. The guiding of a beam can also be denoted as the transferring of a beam. The system comprises planar media. The system also comprises a stack of dielectric layers with a plurality of refractive indices and thicknesses of the layers.

Figure 1:
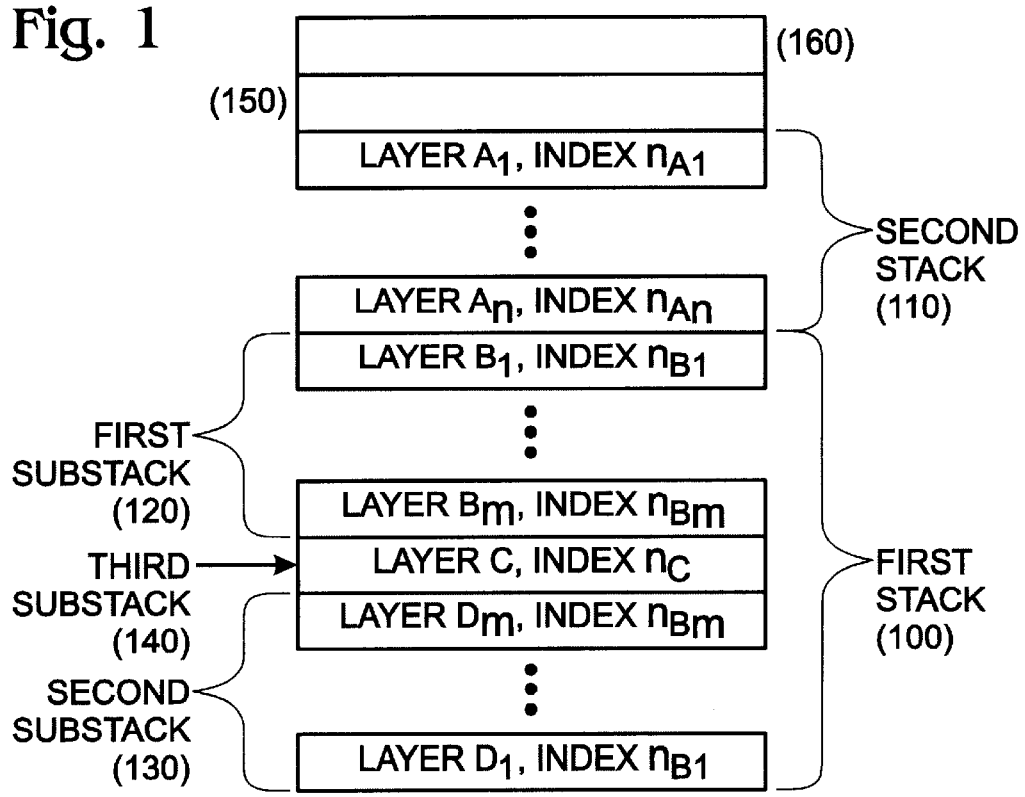
FIG. 1 shows one embodiment of the system for guiding the electromagnetic beam.

The presently preferred embodiments of the invention will now be described by reference to the accompanying figures, wherein like elements are referred to by like numerals. FIG. 1 is a representation of the layers in the system for guiding a beam of electromagnetic radiation. FIG. 1 shows a first stack (100), comprising a first substack (120), a second substack (130) and a third substack (140). The first and second substacks are separated by the third substack (140). The substacks are comprised of dielectric layers. In one embodiment of the invention, a second stack (110) of dielectric layers is also present, the second stack (110) being attached to or abutting the first stack (100). In a further embodiment of the invention, an electromagnetic generating layer (150) is attached to or abutting the second stack (110). In yet another embodiment, a third structure (160) is attached or abutting the electromagnetic generating layer (150). In one embodiment, the third structure (160) is a metal reflector or a grating. However, the third structure (160) is not limited to a metal reflector or a grating.

In one embodiment of the system, the first substack (120) comprises a plurality of dielectric layers and the second substack (130) comprises a plurality of dielectric layers. In an exemplary embodiment, dielectric layers of the first substack (120) and the second substack (130) which are equidistant from the third substack (140) have the same refractive index. For example, as shown in FIG. 1, the layer for $B_1$ has a dielectric index of $n_{B1}$ whereas the layer for $D_1$, which is equidistant with $B_1$ to layer C of the third substack (140), also has a dielectric index of $n_{B1}$. Moreover, the sum of the thickness of dielectric layers of the first substack and the second substack which are equidistant from the third substack is a multiple of half of the vacuum wavelength of the beam divided by the refractive index of the dielectric layers of the first substack and the second substack having a same distance from the third substack. In FIG. 1, the first substack layers are denoted as B layers, the second substack layers are denoted as D layers and the third substack layers are denoted as C layers. In FIG. 1, the third substack layer comprises 1 layer but the invention is not limited thereto.

The dielectric layers can be semiconducting material such as $Al_{(x)}Ga_{(1-x)}As$ or InP but is not limited hereto. Dielectric layers with refractive indices in between 2.9 and 3.6 can be used but the invention is not limited hereto.

The thicknesses d of the layers in the first substack (B) and the second substack (D) satisfy the following relationships where $n_x$ designates the refractive index of layer x, while $\lambda_0$ designates the vacuum wavelength of the beam.

$$d_{Bi} + d_{Di} = k_i \frac{\lambda_0}{2n_{xi}}, \quad \text{with } i = 1 \ldots m \text{ and } k_i = 0, 1, 2, \ldots$$

In a first embodiment of the invention the thickness d of the third substack C satisfies the relationship below. The third substack (140) comprises at least a dielectric layer with a refractive index $n_C$ with a thickness being equal to a multiple $$d_c = l \frac{\lambda_0}{2n_c}, \quad \text{with } l = 0, 1, 2, \ldots$$

of half of the vacuum wavelength of the beam divided by $n_C$.

Under these conditions, the normal incidence transfer matrix for the first stack is always the unit matrix, meaning that for normal incidence, the first stack is fully transparent or opaque.

In a second embodiment of the invention, the system further comprises a second stack (110) of dielectric layers. The number and thicknesses of the layers in the second stack are fully arbitrary. FIG. 1 shows that the second stack is placed on top of the first stack and thus attached to or abutting the first stack. However, alternative placements of the first and second stack are possible. For instance, the placement of the first stack and the second stack can be interchanged.

Moreover, the sequence of layers consisting of the first stack and second stack can be repeated an arbitrary number of times, if necessary with different material parameters in each repetition.

In one example of the second embodiment, the system comprises a periodic repetition of the first and the second stack.

In another example of the second embodiment in the system with periodic repetitions, the refractive index of the dielectric layers are different for at least two repetitions.

In still another example of the second embodiment, the system comprises at least a periodic repetition of the first stack.

In still a further example of the second embodiment in the system with periodic repetition of the first stack, the refractive index of the dielectric layers are different for at least two repetitions.

According to a third embodiment of the invention, the parameters of the stack of the dielectric layers, both the first stack and the second stack, are chosen such that they cooperatively establish a high reflectance of the beam for off-axis incidence, a moderate reflectance of the beam for normal incidence and a negative equivalent penetration depth upon reflection of the beam.

In one embodiment, the first stack is designed for establishing a high reflectance of the beam for off-axis incidence and for realising a negative equivalent penetration depth upon reflection of the beam, while the second stack is designed for moderate reflectance of the beam for normal incidence. As such, the second stack of dielectric layers can be characterised as being substantially reflective for normal incidence radiation. The first stack of dielectric layers can be characterised as being substantially transparent for normal incidence radiation and substantially reflective for off-axis incidence radiation. In one aspect of the invention, a spatial decoupling of the functionalities can thus be recognised Moreover, the exploitation of the phase characteristic of the reflectance of such systems is not known in the art. Specifically, the input-output dynamics of systems (electric, mechanical), characterized by a transfer function, with an amplitude (indicating an amplification or attenuation of the input signal) and a phase (indicating a sort of delay of the input signal), may be investigated. Design of systems is often based on the amplitude characteristic only. In one aspect of the invention, the design exploits the phase characteristic, specifically the so-called penetration depth property of said phase characteristic.

According to another example of the third embodiment, the parameters of the first stack are chosen such that the reflectance of the beam is zero for normal incidence, while being very high for off-axis incidence.

According to still another example of the third embodiment, the stack exhibiting the high off-axis incidence reflectance, the moderate normal incidence reflectance and the negative equivalent penetration depth replaces a traditional Distributed Bragg Reflector (DBR) reflector in a microcavity light emitting diode. The high off-axis incidence reflectance of the stack provides for a narrow radiation pattern, while the negative equivalent penetration depth creates additional resonances in the extraction cone, thereby boosting the extraction efficiency. As compared to traditional DBR reflectors, the reflectance as a function of angle of the stack is such that the existence of leaky modes is greatly suppressed, thereby increasing the efficiency of the photon recycling mechanism. Such a system can be characterised in that it comprises at least one electromagnetic generating layer. Further, in one embodiment, the electromagnetic generating layer (150) is attached at one side to the second stack (110) of dielectric layers. The system is thus adapted for operating as an electromagnetic emitting device.

According to yet another example of the third embodiment, the first stack exhibiting zero normal incidence reflectance and high off-axis incidence reflectance is used as a zero-loss outcoupling mirror in a surface emitting microcavity device. In this particular embodiment, another periodic structure couples one or more guided modes to modes propagating in a direction being substantially normal to the surface. The off-axis propagating guided modes experience high reflectance upon incidence of the outcoupling mirror, thereby leading to high cavity Q-factors.

According to a fourth embodiment of the invented system, the second stack of dielectric layers comprises an alternating sequence of dielectric layers with refractive indices $n_1$ and $n_2$. The thickness of each of the dielectric layers are a quarter of the vacuum wavelength of the beam divided by the refractive index of the corresponding dielectric layer. The second stack of dielectric layers can be characterised as a traditional DBR stack of alternating layers with refractive indices $n_1$ and $n_2$, each having an optical thickness of a quarter wavelength.

According to another example of the fourth embodiment, the second stack of dielectric layers consists of a dielectric layer with refractive index $n_1$ and the thickness of the dielectric layer being a quarter of the vacuum wavelength of the beam divided by $n_1$.

According to still another example of the fourth embodiment of the invented system, the first substack (B) of the first stack consists of a DBR with the same materials as the second substack, thus having the indices $n_1$ and $n_2$. The first substack has an odd total number of layers m. The third substack (C) has an optical thickness of half a wavelength, while the second substack (D) is then the mirror image of the first substack (B). Provided that the total number of layers m is large enough, and/or that the refractive index contrast in the first substack is large enough, the reflectance of the beam will exhibit a negative equivalent penetration depth, i.e. a negative slope of the phase of the reflection coefficient of the beam as a function of incidence angle in the area around normal incidence under the assumption of a $\exp(j\omega t)$ time convention. It is this negative equivalent penetration depth that allows for applying the invention in a microcavity LED context.

In one example, the second stack (110) consists of a single quarter-wavelength-layer (A) of material with the index $n_1$, and the first substack (B) consists of three quarter-wavelength-layers of alternating the indices $n_2$ -$n_1$ -n2. The third substack (C) is a half-wavelength-layer of material with the index $n_1$ while the second substack (D) has the same structure as the first substack (B).

Referring to FIG. 2, there is shown the TE (transverse electrical) reflectance, both amplitude (%) and phase (deg), of the system as shown in FIG. 1 comprising the first stack and the second stack for normal incidence of the beam from the direction of the second stack. The solid line shows the characteristics of one aspect of the present invention, the dashed line shows the reflectance of a traditional DBR mirror. In this example, a vacuum wavelength of the beam is $\lambda_0$=980 nm, and the refractive indices used in this embodiment are $n_1$=1.55, $n_2$=3.5. The negative equivalent penetration depth or negative phase is characteristic for the invention. FIG. 2 compares the reflection characteristics of the stack consisting of the sub-stacks A, B, C and D (as shown in FIG. 1) with those of a traditional DBR structure containing only stack A and not stacks B, C or D. Both structures are embedded in a medium with the index $n_1$. Although for the characteristic, the first stack and the second stack are not repeated, the invention is not limited thereto.

The present invention yields much higher reflectivitities for off-axis incidence while still maintaining the possibility of an arbitrary reflectance for normal incidence by choosing the number of layers in the second stack A. This contrasts to the traditional DBR mirrors, where increasing the number of layers leads to an increase in reflectivity for both the normal and the off-axis incidence. Moreover, the slope of the reflection characteristic as a function of incidence angle of the beam is different for the present invention as compared to a traditional DBR, leading to a negative equivalent penetration depth.

Figure 3:
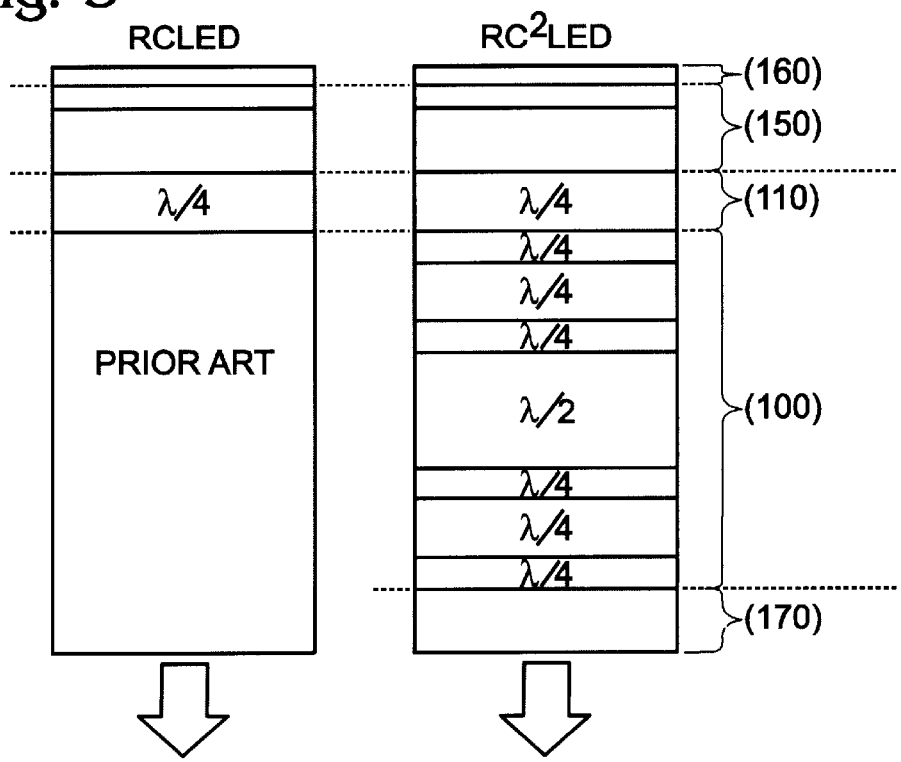
FIG. 3 shows on the left a prior art RCLED and on the right one embodiment of the RC²LED invented system.

In a further embodiment, the structure from the fourth embodiment replaces a traditional DBR mirror in a microcavity light emitting device. This device is henceforth referred to as a $RC^2LED$, while the known device with the DBR reflector is referred to as a RCLED. The name $RC^2LED$ stems from the presence of two resonant cavities (RC), one containing the electromagnetic generating region as in the RCLED, and one RC used in the reflector. The general properties of the two classes of devices are compared using the specific but not limiting examples of the devices outlined in FIG. 3. FIG. 3 shows on the left a prior art RCLED and on the right one embodiment of the $RC^2LED$ invented system. The $RC^2LED$ comprises a metal reflector (160), an electromagnetic radiation generating layer or cavity (150), a second stack (110), here comprising one dielectric layer, a first stack (100) comprising a first substack, a second substack and a third substack. The first and second substacks comprise three dielectric layers, and the third substack, comprises one dielectric layer. The system is attached to a substrate (170).

Figure 4:
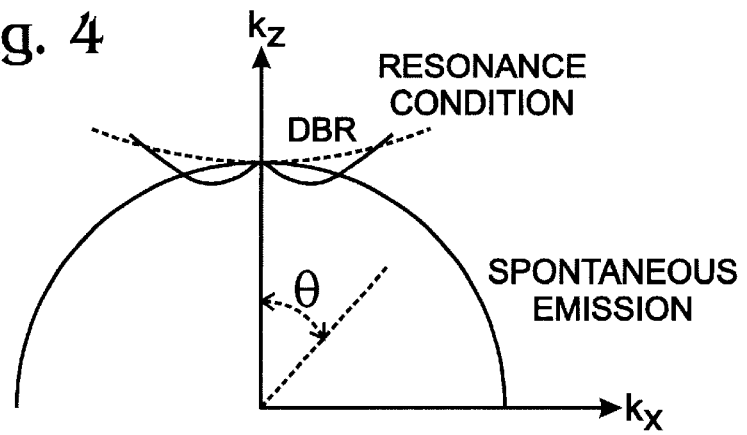
FIG. 4 shows schematic k-diagrams for a RCLED (prior art) (dotted line) and the RC²LED invented system shown in FIG. 3 (solid line).

In a further particular but not limiting example, the devices are bottom emitting at 980 nm, have a top metal mirror (n=0.2–6.5 j) doubling as a current contact, a 189 nm GaAs (n=3.5) resonant cavity and a quantum well (QW) emitting at 980 nm placed at a field maximum. A quantum well is a structure wherein by selection of material properties, bandgap variations are exploited for generating electromagnetic radiation with a selected property. The refractive indices in the bottom reflector (i.e., the first stack (100)) are $n_1$=1.55 and $n_2$=3.5. As discussed previously, n1 is the refractive index of the second layer of the first substack and $n_2$ is the refractive index of the first and third layer of the first substack; hence an $n_2$-$n_1$-$n_2$ is obtained. Since the transmission of the structure is only significant in a small cone around normal incidence, the radiation pattern of the $RC^2LED$ is much more narrow and directive as compared to the RCLED. Moreover, the negative equivalent penetration depth creates extra resonances in the extraction cone, leading to a higher extraction efficiency. The presence of extra resonances is further illustrated in FIG. 4, comparing k-vector diagrams for the RCLED and the $RC^2LED$. FIG. 4 shows schematic k-diagrams for a RCLED (prior art) (dotted line) and the $RC^2LED$ invented system shown in FIG. 3 (solid line). The negative equivalent penetration depth of the invented system results in at least more than one crossing of the circle representing spontaneous emission and the reflection characteristic of the system. Therefore at least more than one resonance condition is found.

Intersection points of the sphere representing spontaneous emission and of the surface representing the resonance condition correspond to resonantly enhanced emitted radiation. As shown in FIG. 4, both devices have a resonance for normal incidence ($\theta$=0), but the $RC^2LED$ exhibits a second resonance because of the negative equivalent penetration depth. The system can be characterised as a system being such that the equivalent penetration depth of the beam is negative.

The optical properties of the RCLED and the $RC^2LED$ as outlined in the specific but not limiting example of FIG. 3 were simulated assuming emitting dipoles oriented parallel to the interface in the stack, the dipoles having Gaussian spontaneous emission spectrum with a FWHM of 45 nm centered at 980 nm, in the absence of a AR coating on the substrate and in the absence of the photon recycling effect. Both devices exhibit an extraction efficiency of about 18%, but the radiation pattern of the $RC^2LED$ is much narrower. For the RCLED, only 34% of the light emitted into air falls within a numerical aperture (NA) of 0.5, whereas for the $RC^2LED$ this figure is as high as 52%. Furthermore, the phase of the reflection of the structure for normal incidence as a function of wavelength also exhibits a negative slope. This creates extra resonances in the wavelength domain, leading to an optical spectrum with multiple peaks. Moreover, in the $RC^2LED$, the presence of leaky modes is significantly suppressed as compared to the traditional RCLEDs, even when the RCLEDs use a larger number of pairs in the DBR. This increases the efficiency of the photon recycling effect. Note that the same degrees of freedom for device design such as changing the cavity length or changing the position of the active layer apply equally well to the $RC^2LED$ as to the RCLED.

In a fifth embodiment of the invention, the second stack (110) of dielectric layers, denoted stack A in FIG. 1, is not present, leading to a structure, comprising the first stack (100), which is fully transparent for normal incidence of the beam, but exhibiting a high off-axis reflectance of the beam.

Figure 5:
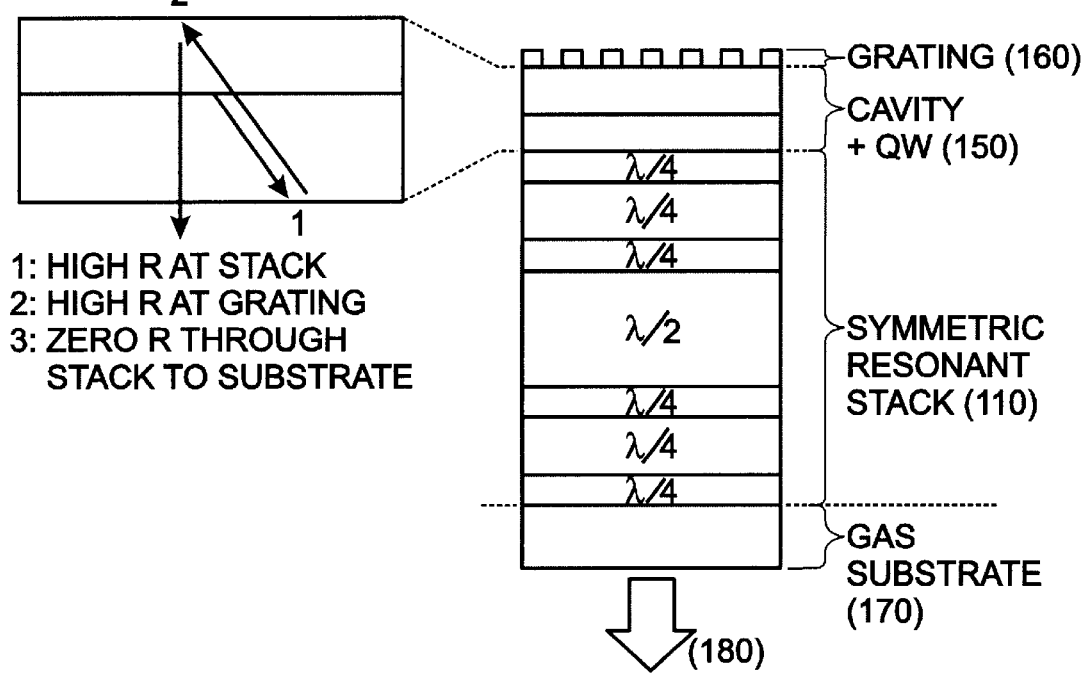
FIG. 5 shows one embodiment of the invention, exploiting a grating in order to enable resonance in a non-normal direction.

In one example, the first stack from the fifth embodiment is employed as a zero-loss outcoupling mirror in a surface emitting microcavity device. The microcavity device furthermore contains a periodic structure coupling one or more guided modes to modes propagating in a direction being substantially normal to the surface. The off-axis propagating guided modes experience high reflectance upon incidence of the outcoupling mirror, thereby leading to high cavity Q-factors, but at the same time providing for very low outcoupling loss. An example of the fifth embodiment of the invention is shown in FIG. 5. FIG. 5 exploits a grating in order to enable resonance in a non-normal direction. The embodiment comprises the first stack, an electromagnetic radiation generating layer and a grating. As the first stack is transparent for normal incidence and highly reflective for non-normal incidence, such decoupling between resonance in one direction and transporting the resulting electromagnetic radiation outside the cavity (180) towards the substrate (170) is enabled.

The invented system can be described as a system for transferring a beam of electromagnetic radiation, the system comprising a stack of dielectric media with a plurality of refractive indices and thicknesses, the stack of the dielectric media containing one or more substacks exhibiting transparency upon normal incidence of the dielectric beam, the parameters of the system further being chosen such that they can cooperatively establish high reflectance upon off-axis incidence of the beam, arbitrary reflectance upon normal incidence of the beam and negative equivalent penetration depth of the beam. The stack can be used as a mirror in a microcavity device. The stack can also be used as a mirror in a microcavity light emitting diode. The mirror provides for a narrow radiation pattern and/or a high extraction efficiency.

Alternatively, the invented system can be described as a system for transferring a beam of electromagnetic radiation, the system comprising a stack of dielectric media with a plurality of refractive indices and thicknesses, the parameters of the system further being chosen such that the stack of the dielectric media is fully transparent for normal incidence of the beam and such that the stack of the dielectric media has high reflectance for off-axis incidence. The stack can again be used as a mirror in a microcavity device or as an outcoupling mirror in a surface emitting microcavity device. When using the stack in the microcavity device, the device can further contain a periodic structure coupling one or more guided modes to modes propagating in a direction being substantially normal to the surface.

The electromagnetic radiation in the invention can be in the range of microwave radiation. The system can also be integrated in microwave antennae.

It is intended that the foregoing detailed description be regarded as illustrative rather than limiting and that it is understood that the following claims, including all equivalents, are intended to define the scope of the invention.

What is claimed is:

1. A system for guiding a beam of electromagnetic radiation, the beam including a vacuum wavelength, the system comprising:
    at least a first stack of dielectric layers; and
    at least one electromagnetic generating layer generating the beam of electromagnetic radiation, the electromagnetic generating layer being outside of the first stack of layers, at least a part of the beam being guided in the first stack of dielectric layers, the first stack comprising:
        a first substack, the first substack including at least one dielectric layer;
        a second substack, the second substack including at least one dielectric layer; and
        a third substack, the third substack including at least one dielectric layer, the third substack separating the first and second substack,
    wherein dielectric layers of the first substack and the second substack equidistant from the third substack have the same refractive index,
    wherein the sum of the thickness of dielectric layers of the first substack and the second substack being equidistant from the third substack is a multiple of half of the vacuum wavelength of the beam divided by the refractive index of the dielectric layers of the first substack and the second substack being equidistant from the third substack,
    wherein the third substack thickness is substantially different from a quarter of the vacuum wavelength of the beam divided by the refractive index of the dielectric layer of the third substack, and
    wherein the first substack and the second substack each have an odd number of layers and comprise dielectric layers with refractive indices $n_1$ and $n_2$; and
    wherein said: refractive indices $n_1$ and $n_2$ are different in value relative to each other, such that the equivalent penetration depth of said beam is negative.

2. The system as recited in claim 1, wherein the first substack comprises a first and second layer with refractive index $n_2$, a third layer with refractive index $n_1$, the first and the third layer abutting one another, the second and the third layer abutting one another, the first and the second layer not abutting one another.

3. The system as recited in claim 1, wherein the first substack is a concatenation of a first layer with refractive index $n_2$, a second layer with refractive index $n_1$ and a third layer with refractive index $n_2$.

4. The system as recited in claim 3, wherein the third substack includes a dielectric layer with index $n_1$.

5. The system as recited in claim 1, further comprising a second stack of dielectric layers, and
    wherein one side of the electromagnetic generating layer abuts the second stack of dielectric layers.

6. The system as recited in claim 5, wherein the second stack of dielectric layers is in between the first stack of dielectric layers and the electromagnetic generating layer.

7. The system as recited in claim 1, wherein one side of the electromagnetic generating layer abuts the first stack of dielectric layers.

* * * * *